(12) United States Patent
Yaoita et al.

(10) Patent No.: US 12,227,991 B2
(45) Date of Patent: Feb. 18, 2025

(54) LAMINATED BODY AND DOOR OR WALL

(71) Applicant: AGC Inc., Tokyo (JP)

(72) Inventors: Kazuya Yaoita, Tokyo (JP); Soshi Watanabe, Tokyo (JP); Yuji Endo, Tokyo (JP)

(73) Assignee: AGC INC., Tokyo (JP)

( * ) Notice: Subject to any disclaimer, the term of this patent is extended or adjusted under 35 U.S.C. 154(b) by 247 days.

(21) Appl. No.: 17/748,516

(22) Filed: May 19, 2022

(65) Prior Publication Data

US 2022/0275681 A1    Sep. 1, 2022

Related U.S. Application Data

(63) Continuation of application No. PCT/JP2020/036555, filed on Sep. 28, 2020.

(30) Foreign Application Priority Data

Nov. 27, 2019  (JP) ................. 2019-214646

(51) Int. Cl.
| | |
|---|---|
| *E06B 9/24* | (2006.01) |
| *C23C 14/06* | (2006.01) |
| *C23C 14/18* | (2006.01) |
| *C23C 14/35* | (2006.01) |
| *C23C 14/58* | (2006.01) |

(52) U.S. Cl.
CPC ............ *E06B 9/24* (2013.01); *C23C 14/0652* (2013.01); *C23C 14/18* (2013.01); *C23C 14/35* (2013.01); *C23C 14/5806* (2013.01); *E06B 2009/2417* (2013.01)

(58) Field of Classification Search
None
See application file for complete search history.

(56) References Cited

U.S. PATENT DOCUMENTS

| | | | |
|---|---|---|---|
| 2003/0203215 A1* | 10/2003 | Shimatani | C03C 17/3626 |
| | | | 428/432 |
| 2004/0053068 A1 | 3/2004 | Schicht et al. | |

(Continued)

FOREIGN PATENT DOCUMENTS

| | | | | |
|---|---|---|---|---|
| CN | 203793139 U | * | 8/2014 | |
| CN | 106431003 A | * | 2/2017 | |
| DE | 10015632 C1 | * | 9/2001 | ............ F24B 13/004 |

(Continued)

OTHER PUBLICATIONS

International Searching Authority, "International Search Report," issued in connection with International Patent Application No. PCT/JP2020/036555, dated Nov. 2, 2020.

(Continued)

*Primary Examiner* — David Sample
(74) *Attorney, Agent, or Firm* — Foley & Lardner LLP

(57) ABSTRACT

A laminated body includes a glass substrate; and a laminated film installed on a surface of the glass substrate. The laminated film includes, from a side of the glass substrate, a first layer containing silicon nitride; a second layer containing silicon; and a third layer containing silicon nitride. A transmittance of visible light incident from the side of the glass substrate is greater than or equal to 10%. A surface resistance value measured from a side of the laminated film is greater than 200 $\Omega$/sq.

14 Claims, 3 Drawing Sheets

(56) References Cited

U.S. PATENT DOCUMENTS

2016/0023941 A1     1/2016   Brown et al.
2020/0115276 A1     4/2020   Wanakule et al.

FOREIGN PATENT DOCUMENTS

| EP | 3159610 A1 * | 4/2017 | ............... A21B 3/02 |
|----|---|---|---|
| ES | 2364938 A1 * | 9/2011 | ............... B60J 11/08 |
| JP | H07-104104 A | 4/1995 | |
| JP | 2004-514636 A | 5/2004 | |
| JP | 2017-523949 A | 8/2017 | |
| JP | 2002-173340 A | 6/2022 | |
| WO | WO-02/42234 A1 | 5/2002 | |

OTHER PUBLICATIONS

International Searching Authority, "Written Opinion," issued in connection with International Patent Application No. PCT/JP2020/036555, dated Nov. 2, 2020.

\* cited by examiner

LAMINATED BODY AND DOOR OR WALL

CROSS-REFERENCE TO RELATED APPLICATION

The present application is a continuation application of International Application No. PCT/JP2020/036555, filed Sep. 28, 2020, which claims priority to Japanese Patent Application No. 2019-214646 filed Nov. 27, 2019. The contents of these applications are incorporated herein by reference in their entirety.

BACKGROUND OF THE INVENTION

1. Field of the Invention

The present disclosure relates to a laminated body and a door or a wall.

2. Description of the Related Art

A laminated body having a laminated film installed on a glass substrate including a metallic reflection layer is used, for example, for half mirrors and decorative walls.

For example, Japanese Translation of PCT International Application Publication No. JP-T-2004-514636 describes a laminated body having a laminated film on a glass substrate, the laminated film including a dielectric base layer, a chromium layer, and a dielectric nitride cover layer.

SUMMARY OF INVENTION

Problem to be Solved by the Invention

Recently, an application of the above-described laminated bodies to apparatuses including touch panels has been studied. For example, if the laminated body is applied to a member such as a door or wall containing a touch panel (hereinafter referred to as a "touch panel containing apparatus"), it is possible to provide a touch panel containing apparatus having a function of a half mirror.

However, each of conventional laminated bodies has a laminated film having a metal layer for adjusting a reflectance. In the touch panel containing apparatus, the presence of such a metal layer prevents the touch panel from operating properly. Accordingly, there is a problem in that conventional laminated bodies are not suitable for application to touch panel containing apparatuses.

The present invention has been made in view of the above-described problem, and aims at providing a laminated body capable of application to a touch panel containing apparatus. The present invention also aims at providing a door or a wall having such a laminated body.

Means for Solving Problems

According to an aspect of the present disclosure, a laminated body including a glass substrate; and a laminated film installed on a surface of the glass substrate, the laminated film including, from a side of the glass substrate, a first layer containing silicon nitride, a second layer containing silicon, and a third layer containing silicon nitride, a transmittance of visible light incident from the side of the glass substrate being greater than or equal to 10%, and a surface resistance value measured from a side of the laminated film being greater than 200 Ω/sq, is provided.

According to another aspect of the present disclosure, a door or a wall including a touch panel; and the laminated body provided with the above-described features, and the touch panel being mounted on a side of the laminated film of the laminated body, is provided.

Effects of the Invention

According to the present invention, the present invention provides a laminated body capable of application to a touch panel apparatus. The present invention also provides a door or wall having such a laminated body.

BRIEF DESCRIPTION OF DRAWINGS

Other objects and further features of the present disclosure will be apparent from the following detailed description when read in conjunction with the accompanying drawings, in which.

MODE FOR CARRYING OUT THE INVENTION

Hereinafter, an embodiment of the present invention will be described with reference to the drawings.

Laminated Body According to the Embodiment of the Present Invention

Figure 1:
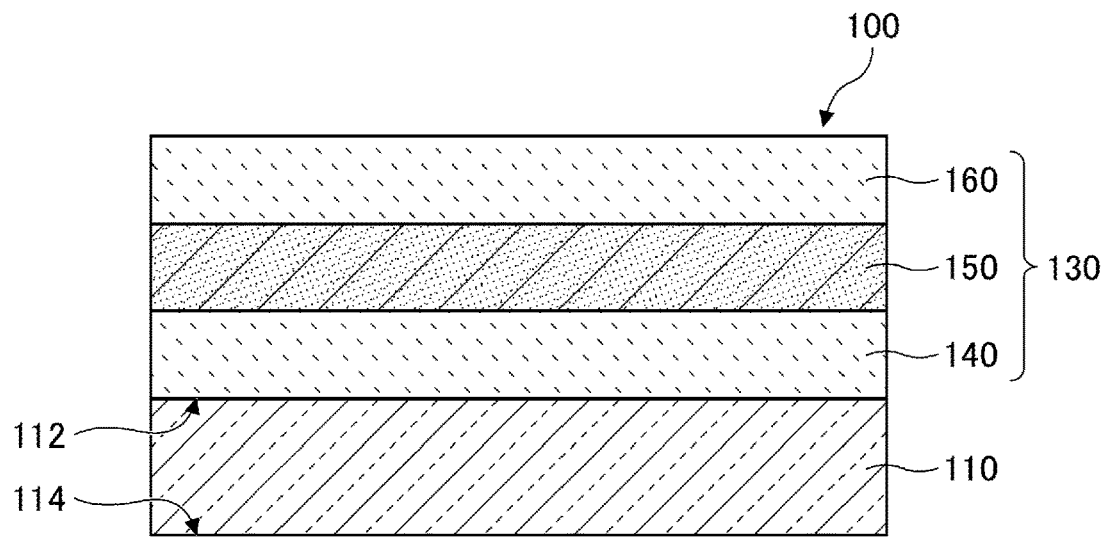
FIG. 1 is a cross-sectional view schematically depicting a configuration of a laminated body according to an embodiment of the present invention.

FIG. 1 is a diagram schematically illustrating a cross-section of a laminated body according to the embodiment of the present invention.

As shown in FIG. 1, the laminated body 100 according to the embodiment of the present invention (hereinafter referred to as the "first laminated body") includes a glass substrate 110 and a laminated film 130. The glass substrate 110 has a first surface 112 and a second surfaces 114, opposite to each other. The laminated film 130 is installed on a side of the first surface 112 of the glass substrate 110.

The laminated film 130 has a first layer 140, a second layer 150, and a third layer 160, in order of closeness to the glass substrate 110.

Each of the first layer 140 and the third layer 160 includes a layer mainly made of silicon nitride. On the other hand, the second layer 150 includes a layer mainly made of silicon.

In the specification of the present application, the term "layer mainly made of a substance" means that the layer contains the substance by 50 percent by mass or more.

The second layer 150 mainly has a role of expressing desired reflection property of the laminated film 130. In contrast, the first layer 140 and the third layer 160 mainly have a role of protecting the second layer 150. For example, with the presence of the first layer 140 and the third layer 160, oxidation of the second layer 150 is suppressed when the heat treatment is performed for the first laminated body 100 or its precursors. The third layer 160 can also enhance the abrasion resistance of the laminated film 130.

The first laminated body 100 has a surface resistance value of greater than 200 Ω/sq when measured from the side of the laminated film 130. The first laminated body 100 also has a feature in which a transmittance of visible light incident from the side of the glass substrate 110, that is, a visible light transmittance, is greater than or equal to 10%.

Here, as described above, the conventional laminated body, which includes a metal layer in the laminated film, has the problem in that the laminated body is difficult to be applied to a touch panel containing apparatus because the touch panel does not operate properly.

However, in the first laminated body 100, the laminated film 130 does not include a metal layer, such as the conventional chromium layer, as a reflection layer. That is, in the first laminated body 100, the second layer 150 that expresses the reflection property includes a layer that is mainly made of silicon, which is a semiconductor material.

The first laminated body 100 also has a visible light transmittance of greater than or equal to 10%.

In addition, the first laminated body 100 has a feature in which a surface resistance value is greater than 200 Ω/sq.

Accordingly, the first laminated body 100 can be suitably applied to a touch panel containing apparatus.

Additionally, with the first laminated body 100, it is possible to express a desired reflection property and a desired transmission property by adjusting the thickness or the like of the second layer 150 of the laminated film 130.

Accordingly, when the first laminated body 100 is applied to a touch panel containing apparatus, it is possible to express a function of a half mirror. In addition, it is also possible to provide a touch panel containing apparatus which is excellent in design, by adjusting the reflection color.

Each Member Included in Laminated Body

Next, each member included in the laminated body according to the embodiment of the present invention will be described in more detail.

For the sake of clarity, component members of the first laminated body 100 illustrated in FIG. 1 will be described, as an example. Accordingly, for indicating each member, the reference numeral in FIG. 1 will be used.

Glass Substrate 110

A conventional glass substrate may be used as the glass substrate 110. In particular, the average visible light transmittance of the glass substrate 110 is preferably 80% or more.

The glass substrate 110 may also be chemically tempered or thermally tempered.

First Layer 140

The first layer 140 includes a layer mainly made of silicon nitride.

The first layer 140 may further contain aluminum. An amount of aluminum contained in the first layer 140 is, for example, 30 percent by mass or less at maximum, and preferably 20 percent by mass or less.

A thickness of the first layer 140 falls within a range, for example, from 3 nm to 80 nm. The thickness of the first layer 140 preferably falls within a range from 5 nm to 30 nm.

Second Layer 150

The second layer 150 includes a layer mainly made of silicon. The silicon is preferably amorphous silicon. In the specification of the present application, "amorphous" means that no peaks are observed in the X-ray diffraction pattern by an X-ray diffraction apparatus.

The second layer 150 may further contain aluminum, carbon, or both. An amount of aluminum contained in the second layer 150 is, for example, 30 percent by mass or less at maximum, and preferably 20 percent by mass or less. An amount of carbon contained in the second layer 150 is, for example, 30 percent by mass or less at maximum, and preferably 20 percent by mass or less. By setting the amount of carbon contained in the second layer 150 to 30 percent by mass or less at maximum, a decrease in the surface resistance value can be significantly suppressed.

The second layer 150 preferably does not contain oxygen and nitrogen. This is because these elements can adversely affect the reflection property of the second layer 150.

Each of a content of oxygen and a content of nitrogen contained in the second layer 150 is preferably less than 10 atomic percent. A sum of the content of oxygen and the content of nitrogen contained in the second layer 150 is preferably less than 15 atomic percent.

In the present application, the amount of element contained in each layer was determined by an X-ray photoelectron spectroscopy (XPS) analysis. Apparatus conditions for the XPS analysis are as follows.

Measurement apparatus; PHI Quantera II (by ULVAC-PHI, Inc.)
Measurement conditions
Ion flood gun; used
Photoelectron extraction angle; 45°
Setting for X-ray; Al monochrome 100 μm φ 25 W, and 15 kV
Path energy; 224 eV
Step size; 0.4 eV
Measured elements; C, O, N, Si, Al, Ca, and Na
Number of sweeps for each element; 5
Sputter power; 1 kV
Sputter area; 2 mm×2 mm
Interval; 0.25 minutes.

In the second layer 150, a ratio of a content of nitrogen to a content of silicon, N/Si, is preferably less than or equal to 0.10.

Here, the ratio N/Si in the second layer 150 is calculated from results of the XPS analysis in the depth direction of the second layer 150, as follows.

Determining a point in the second layer 150 with the highest measured value of silicon (hereinafter referred to as a "center point").

Obtaining a value of nitrogen at the center point.

Calculating the ratio N/Si from the measured value of silicon and the measured value of nitrogen at the center point.

The thickness of the second layer 150 falls, for example, within a range from 3 nm to 40 nm. The thickness of the second layer 150 preferably falls within a range from 5 nm to 30 nm.

Third Layer 160

A thickness of the third layer 160 falls, for example, within a range from 3 nm to 80 nm. The thickness of the third layer 160 preferably falls within a range from 5 nm to 60 nm.

Since for the third layer 160 the above-described description regarding the first layer 140 can be referenced, detailed description regarding the third layer 160 will be omitted here.

Laminated Film 130

The basic configuration of the laminated film 130 has been described above. However, the laminated film 130 may further have a protection layer on the uppermost surface.

Suitable protection layers may include, for example, titania layers and zirconia layers.

Also, in the example shown in FIG. 1, in the laminated film 130, the first layer 140 and the second layer 150 are adjacent to each other. The third layer 160 and the second layer 150 are adjacent to each other.

However, this is merely an example, and there may be another layer (other than a metal layer) between the first layer 140 and the second layer 150, between the third layer 160 and the second layer 150, or both.

Similarly, there may be another layer (other than a metal layer) between the glass substrate 110 and the first layer 140. However, any oxide layer is preferably not present between the glass substrate 110 and the first layer 140. In this case, as will be described later, it becomes possible to suppress an increase in a haze value when the heat treatment is performed for the first laminated body 100 in order to thermally temper the glass substrate 110.

A number of layers in the laminated film 130 is preferably 10 or less. When the number of layers is 10 or less, the thickness of the laminated body can be reduced, and an increase in internal stress is suppressed, so that the durability is improved.

First Laminated Body 100

The first laminated body 100 has a surface resistance value of greater than 200 Ω/sq as measured from the side of the laminated film 130. The surface resistance value is preferably 400 Ω/sq or more.

The first laminated body 100 has a visible light transmittance Tv of 10% or more when measured from the glass substrate 110 toward the laminated film 130. The visible light transmittance Tv is preferably 20% or more.

Here, the "visible light transmittance Tv" is a value obtained based on ISO 9050:2003.

The first laminated body 100 preferably has a visible light reflectance Rv of 20% or more when measured from the side of the glass substrate 110, and more preferably has the visible light reflectance Rv of 25% or more.

Here, the "visible light reflectance Rv" is a value obtained based on ISO 9050:2003.

The first laminated body 100 preferably has a ratio of the visible light transmittance Tv to the visible light reflectance Rv, i.e., Tv/Rv, which falls within a range of 0.3≤Tv/Rv≤2.0. In this case, the first laminated body 100 can be utilized as a suitable half mirror.

The first laminated body 100 preferably has a reflection color $b^*$ that satisfies a relation of $-10 < b^* < 15$ from the viewpoint of design.

In the present application, color tone of the reflection color is determined based on the CIE 1976$L^*a^*b^*$ chromaticity coordinates.

In addition, in the first laminated body 100, the haze value may be less than 0.5%.

Application Examples

The laminated body according to the embodiment of the present invention can be applied to doors, walls, and the like, that have touch panels.

Hereinafter, an application example of the laminated body according to the embodiment of the present invention will be described with reference to FIG. 2.

Figure 2:
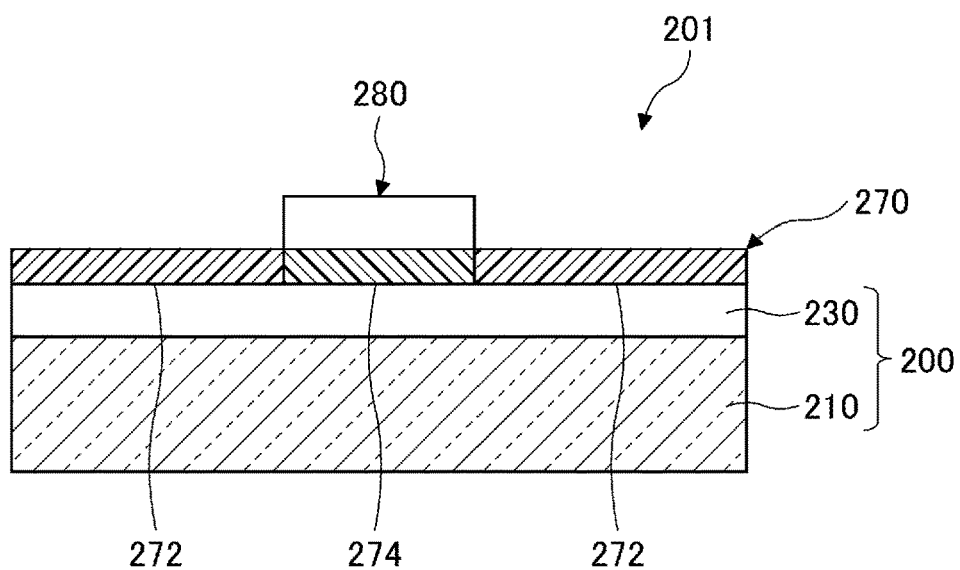
FIG. 2 is a cross-sectional view schematically depicting a door, to which the laminated body according to the embodiment of the present invention is applied.

FIG. 2 schematically shows a cross-section of the door on which the laminated body according to the embodiment of the present invention is installed.

As shown in FIG. 2, the door 201 includes the laminated body 200, an organic substance layer 270, and a touch panel 280.

The laminated body 200 has a glass substrate 210 and a laminated film 230. The organic substance layer 270 is installed on the laminated film 230. Also, the touch panel 280 is installed on the organic substance layer 270.

The organic substance layer 270 is installed to enhance the design property of the door 201.

The organic substance layer 270 has a first portion 272 and a second portion 274. The first portion 272 of the organic substance layer 270 is made of a resin containing, for example, a colorant such as carbon black. As the resin, for example, epoxy resin, (meth)acrylic resin, melamine resin, urethane resin, or alkyd resin may be used.

On the other hand, the second portion 274 of the organic substance layer 270 corresponds to a portion directly under the touch panel 280. The second portion 274 must be made of transparent organic substance so as not to interfere with the operation of the touch panel 280. Such transparent organic substance may, for example, be made of the above-described resin or the like.

Here, in the door 201, the laminated body 200 includes the laminated body according to the embodiment of the present invention, e.g., the first laminated body 100 as described above.

As described above, the laminated body 200 does not contain a metal reflection layer in the laminated film 230, but instead a second layer containing silicon is used. The laminated body 200 also has a visible light transmittance Tv of 10% or more and a surface resistance value of greater than 200 Ω/sq.

Accordingly, the door 201 allows the touch panel to operate properly.

As described above, referring to FIG. 2, the touch panel containing door 201 provided with the laminated body according to the embodiment of the present invention has been described. However, the application of the laminated body according to the embodiment of the present invention is not limited thereto. For example, the laminated body according to the embodiment of the present invention may be applied to a wall having a touch panel. Alternatively, the laminated body according to the embodiment of the present invention may be applied to other touch panel containing apparatuses.

Method for Producing a Laminated Body
According to an Embodiment of the Invention Next, a method of producing a laminated body according to an embodiment of the present invention will be described with reference to FIG. 3.

Figure 3:
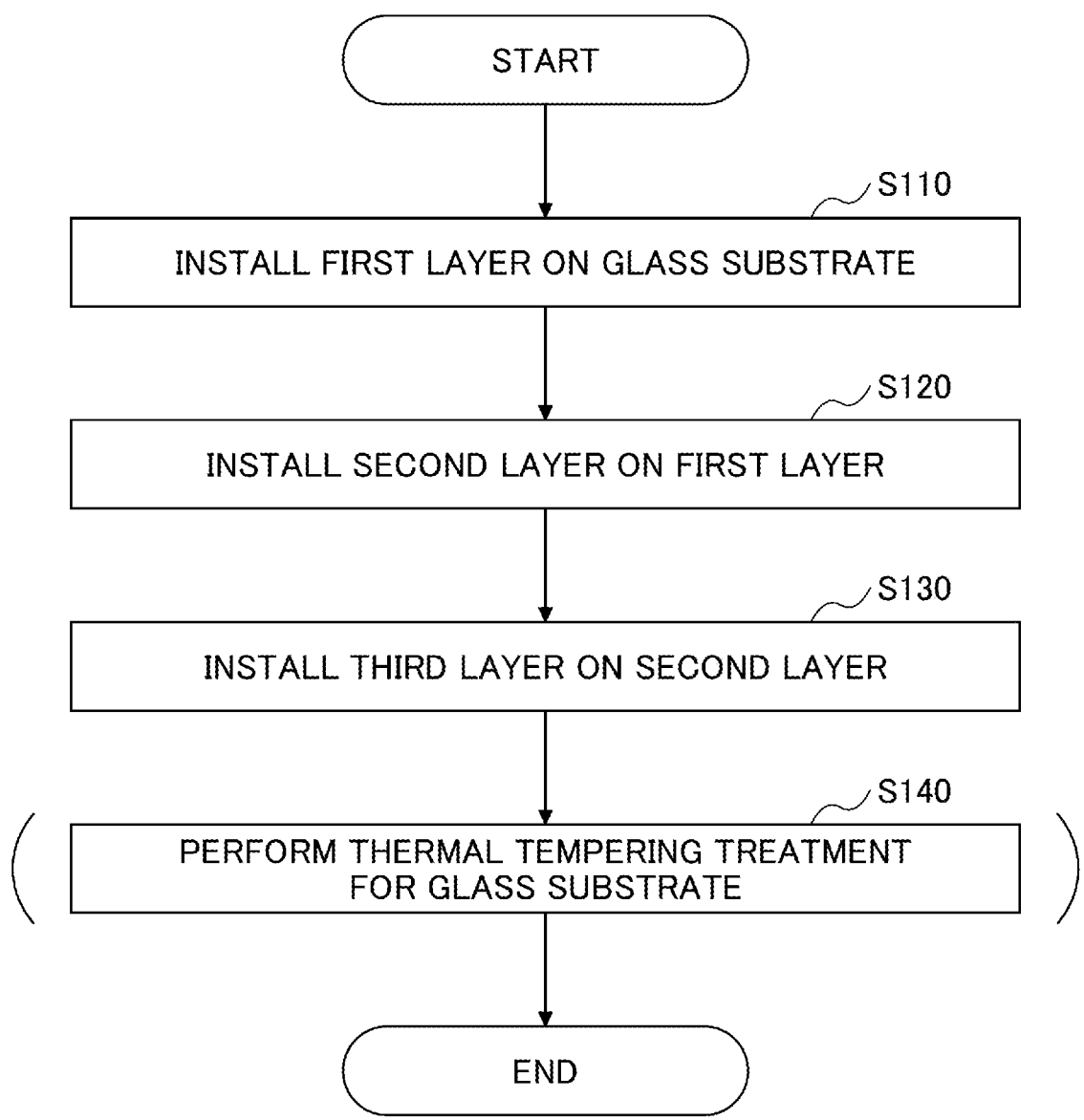
FIG. 3 is a flowchart schematically illustrating an example of a method of producing the laminated body according to the embodiment of the present invention.

FIG. 3 schematically shows a flow of a method of producing a laminated body according to the embodiment of the present invention (hereinafter referred to as the "first producing method").

As shown in FIG. 3, the first producing method includes a step of installing a first layer on a glass substrate (step S110);

a step of installing a second layer on the first layer (step S120);

a step of installing a third layer on the second layer (step S130); and a step of thermally tempering the glass substrate, performed when necessary (step S140).

Each process will be described below. Here, a method of producing the first laminated body 100 illustrated in FIG. 1 will be described with reference to the first laminated body 100, as an example. Accordingly, when indicating each member, the reference numeral shown in FIG. 1 will be used.

Step S110

First, a glass substrate 110 is prepared. A first layer 140 mainly made of silicon nitride is installed on a first surface 112 of the glass substrate 110.

An installation method of the first layer 140 is not particularly limited, and the first layer 140 may be deposited using any conventional deposition method. The first layer 140 may be deposited, for example, by a sputtering method.

Step S120

Next, a second layer 150 mainly made of silicon is installed on the first layer 140. An installation method of the second layer 150 is not particularly limited and the second layer 150 may be deposited using any conventional deposition method. The second layer 150 may be deposited, for example, by the sputtering method.

Step S130

Next, a third layer 160 mainly made of silicon nitride is installed on the second layer 150. An installation method of the third layer 160 is not particularly limited and the third layer 160 may be deposited using any conventional deposition method. The third layer 160 may be deposited, for example, by the sputtering method.

Incidentally, when any of the first layer 140 to the third layer 160 are deposited by the sputtering method, each layer may be deposited in the same sputtering apparatus. In this case, the glass substrate need not be inserted or ejected each time a layer is deposited, and thus the deposition process can be performed efficiently.

Alternatively, each layer may be installed continuously using an in-line deposition apparatus. In the in-line deposition apparatus, each layer is sequentially deposited while the glass substrate is being conveyed in the apparatus.

Step S140

According to the processes to the step S130, the first laminated body 100 having the above-described configuration can be produced. However, if necessary, step S130 may be followed by an additional step of thermally tempering the glass substrate 110.

Such thermally tempering treatment is typically carried out at a temperature that falls within a range from 600° C. to 700° C.

It should be noted that the laminated film 130 includes the second layer 150 mainly made of silicon. However, the second layer 150 is sandwiched between the first layer 140 and the third layer 160. Accordingly, the problem where the second layer 150 is thermally affected and degenerated during the thermally tempering treatment is unlikely to occur. That is, before and after the thermally tempering treatment, the laminated film 130 is almost unchanged.

For example, in the first laminated body 100, a haze value can be made less than 0.5% after the thermally tempering treatment.

However, when a process of installing an oxide layer on the first surface 112 of the glass substrate 110 is performed before the step S110, the haze value after the thermally tempering treatment may be 0.5% or more.

Accordingly, the process of installing an oxide layer directly over the glass substrate 110 is preferably not performed.

Additional Process

According to the above-described processes, the first laminated body 100 can be produced. However, when the above-described door 201 shown in FIG. 2 is produced, the following additional process may be performed.

Installation of Organic Substance Layer

When the door 201 is produced, an organic substance layer 270 is further installed on the side of the laminated film 130 of the first laminated body 100.

The method of forming the organic substance layer 270 is not particularly limited. The organic substance layer 270 may be installed, for example, by a screen printing method.

As described above, the organic substance layer 270 has a first portion 272 and a second portion 274. Thus, the first portion 272 may be configured by screen-printing a resin containing a dye, and the second portion 274 may be configured by screen-printing a resin without a dye (transparent).

After installation of the organic substance layer 270, the first laminated body 100 may be subjected to the heat treatment. Thus, the organic substance layer 270 is dried and fixed over the third layer 160.

The temperature of the heat treatment may fall within a range, for example, from 50° C. to 200° C.

Installation of Touch Panel

A touch panel 280 is then installed on the second portion 274 of the organic substance layer 270.

According to the above-described processes, the above-described door 201 shown in FIG. 2 can be produced.

It is clear for persons skilled in the art that the first producing method is merely one example, and that the laminated body according to the embodiment of the present invention can also be manufactured by another producing method.

EXAMPLES

Hereinafter, examples of the present invention will be described. In the following descriptions, Examples 1 to 6 and 21 are practical examples, and Example 11 is a comparative example.

Example 1

A laminated body was fabricated by the following method.

First, a glass substrate (soda lime glass FL4, with a thickness of 4 mm, by AGC Inc.) was prepared. Next, a laminated film was deposited on a glass substrate by a sputtering method. The laminated film has a three layer configuration: a first layer, a second layer, and a third layer.

An in-line sputtering apparatus for laboratory was used as the deposition apparatus, and the laminated film was formed by sequentially depositing three layers by a reactive DC magnetron sputtering method while conveying the glass substrate in a deposition chamber.

A polysilicon target was used as the target for deposition of each layer. In the deposition chamber, vacuum was evacuated to $2.0 \times 10^{-4}$ Pa.

The first layer was a silicon nitride layer (target thickness was 20 nm), and a mixture gas of argon and nitrogen (mixing ratio was $Ar:N_2=40$ sccm:60 sccm) was used as the discharge gas. A dimension of the target was $70 \times 200$ mm$^2$ and the sputtering power was 500 W. The pressure in the deposition chamber was 0.4 Pa.

The second layer was a silicon layer (target thickness was 23 nm), and argon gas was introduced as the discharge gas at 100 sccm. The sputtering power was 500 W.

The third layer was a silicon nitride layer (target thickness was 10 nm). The deposition conditions for the third layer were the same as those for the first layer.

After the laminated film was formed on the glass substrate by the above-described method, the resulting laminated body was subjected to the heat treatment in order to thermally temper the glass substrate. The heat treatment temperature was 650° C.

The resulting laminated body is referred to as "Sample 1".

Examples 2 to 5

The laminated bodies were fabricated by the same method as in Example 1. However, in Examples 2 to 5, the thickness of each layer included in the laminated film was changed from that of Example 1.

The resulting laminated bodies are referred to as "Sample 2" to "Sample 5," respectively.

Example 6

The laminated body was fabricated by the same method as in Example 1. However, in Example 6, a titania layer (target thickness was 40 nm) was formed on the glass substrate before the first layer was formed on the glass substrate.

The titania layer was formed using a titanium target. As the discharge gas, a mixture gas of argon and oxygen (mixing ratio was $Ar:O_2=40$ sccm:60 sccm) was introduced. The sputtering power was 500 W.

The resulting laminated body is referred to as "Sample 6."

Example 11

The laminated body was fabricated by the same method as in Example 1. However, in Example 11, a metal chromium layer (target thickness was 13 nm) was formed as the second layer.

The metal chromium layer was formed using a chromium target. Argon gas was introduced as the discharge gas at 100 sccm. The sputtering power was 500 W.

The resulting laminated body is referred to as "Sample 11".

Example 21

The laminated body was produced under conditions closer to the actual production process. In other words, the laminated body was fabricated using an in-line deposition apparatus for production. It can be said that the laminated film deposited by this apparatus is more liable to be affected by impurities than that by the above-described apparatus for laboratory.

The laminated body has a laminated film with a three-layer structure on a glass substrate (soda lime glass FL4 with a thickness of 4 mm: by AGC Inc.)

The configuration of the laminated film was as follows:
First layer: SiAlN with a target thickness of 10 nm (Al=10 atomic percent)
Second layer: SiAl with a target thickness of 23 nm (Al=10 atomic percent)
Third layer: SiAlN with a target thickness of 20 nm (Al=10 atomic percent).

For deposition of the first, second, and third layers, SiAl targets were used.

After the deposition, the laminated body was subjected to the heat treatment in the same manner as in Example 1.

The resulting laminated body is referred to as "Sample 21".

TABLE 1 below summarizes specifications of the layered films in the respective samples.

TABLE 1

| Sample | First layer Material | First layer Thickness (nm) | Second layer Material | Second layer Thickness (nm) | Third layer Material | Third layer Thickness (nm) | Remarks |
|---|---|---|---|---|---|---|---|
| 1 | SiN | 20 | Si | 23 | SiN | 10 | |
| 2 | SiN | 20 | Si | 17 | SiN | 10 | |
| 3 | SiN | 3 | Si | 6 | SiN | 25 | |
| 4 | SiN | 20 | Si | 4 | SiN | 10 | |
| 5 | SiN | 60 | Si | 10 | SiN | 3 | |
| 6 | SiN | 20 | Si | 23 | SiN | 10 | Titania layer (40 nm) was formed between first layer and substrate |
| 11 | SiN | 20 | Cr | 13 | SiN | 10 | |
| 21 | SiAlN | 10 | SiAl | 23 | SiAlN | 20 | Fabricated using production apparatus |

Figure 4:
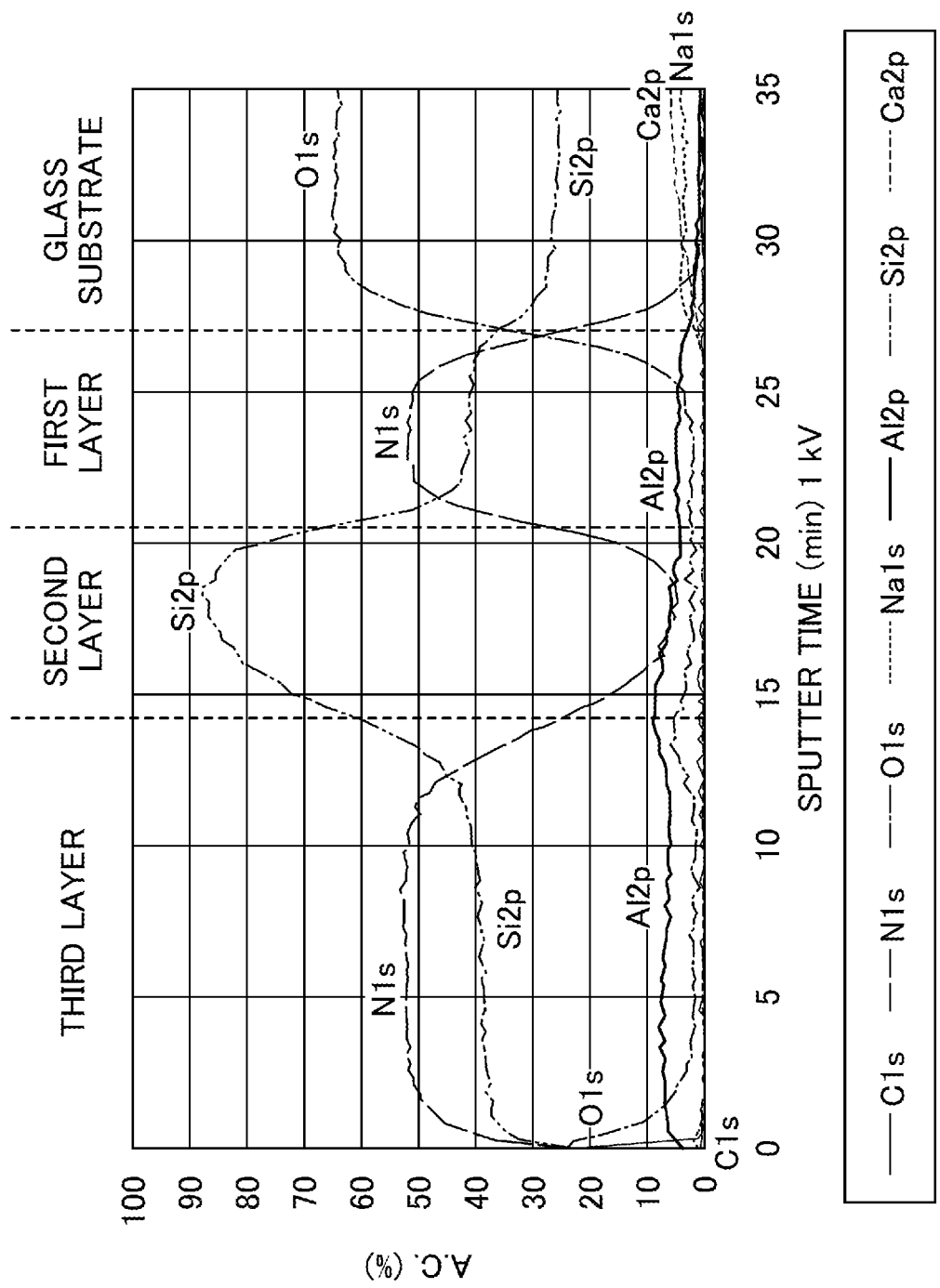
FIG. 4 is a diagram depicting an example of results of analysis by an X-ray photoelectron spectroscopy (XPS) for the laminated film of the laminated body according to the embodiment of the present invention.

FIG. 4 shows a result of X-ray photoelectron spectroscopy (XPS) analysis obtained for the laminated film of Sample 21. However, this result corresponds to the state before the thermally tempering treatment for Sample 21 (i.e., the measurement was performed for the sample that had not been subjected to the heat treatment).

In FIG. 4, the horizontal axis represents a sputtering time (corresponding to a thickness of the layer) and the vertical axis represents an atomic concentration (any unit) of each element.

In FIG. 4, peaks corresponding to the three layers included in the laminated film of Sample 21 appear. Also, from FIG. 4, the second layer is found to contain little N and O as impurities.

The ratio of the nitrogen content to the silicon content, N/Si, in the second layer calculated from the result was 0.06.

The above-described analysis was performed for the laminated film of Sample 21 (i.e., after the heat treatment was performed), and the result of the analysis was almost the same as the result shown in FIG. 4, and no significant difference was observed.

Evaluation

Characteristics of the respective samples were evaluated by using the following methods.

Optical Characteristics

A spectrophotometer (U4100: by HITACHI, Ltd.) was used to evaluate optical characteristics of the respective samples.

The visible light transmittance Tv and the visible light reflectance Rv of the samples were measured based on ISO 9050:2003. The visible light transmittance Tv was measured from the glass substrate toward the laminated film. The visible light reflectance Rv was measured from the side of the glass substrate.

The ratio Tv/Rv was calculated from the obtained results.

In addition, the color tone of the reflection color was evaluated based on the CIE 1976L*a*b* chromaticity coordinates.

Surface Resistance Value

The surface resistance values of the respective samples were measured.

A portable surface resistance value measurement apparatus (STRATOMETER: by NAGY Messsysteme GmbH) was used as the measurement apparatus. Measurements were made on the surface side of the laminated film of each sample (10 cm×10 cm).

Haze Value

The haze values of the respective samples were measured.

A haze meter was used for measuring haze values. In each sample, the haze value was measured from the side of the glass substrate.

Results

Table 2 below summarizes results of evaluation obtained for the respective samples.

TABLE 2

| Sample | Visible light transmittance Tv (%) | Visible light reflectance Rv (%) | Tv/Rv | Surface resistance value (Ω/sq) | Color tone (a*, b*) | Haze value after heat treatment (%) |
|---|---|---|---|---|---|---|
| 1 | 36 | 45 | 0.80 | >1000 | (−3, 1) | 0.2 |
| 2 | 43 | 40 | 1.08 | >1000 | (−4, −1) | 0.2 |
| 3 | 59 | 30 | 2.00 | >1000 | (−4, −7) | 0.2 |
| 4 | 66 | 22 | 3.00 | >1000 | (−3, −3) | 0.2 |
| 5 | 53 | 26 | 2.04 | >1000 | (1, 15) | 0.2 |
| 6 | 44 | 33 | 1.33 | >1000 | (4, 30) | 0.5 |
| 11 | 9 | 38 | 0.24 | 100 | (0, 12) | 0.2 |
| 21 | 23 | 45 | 0.51 | >1000 | (−3, 0) | 0.2 |

As is clear from TABLE 2, Sample 11 exhibited a low surface resistance value and a low visible light transmittance Tv. Sample 11 with such characteristics is considered to be difficult to be applied to touch panels. In contrast, Samples 1-6 and 21 exhibit the surface resistance value of greater than 1000 Ω/sq and the visible light transmittance Tv of 10% or more. Samples 1-6 and 21 having such characteristics can be suitably applied to touch panels.

For Samples 1-4 and sample 21, the parameter b* of the color tone is found to satisfy a relation −10<b*<15. When the laminated bodies with such color tone are applied to touch panel containing apparatuses, the laminated bodies can enhance design of the apparatuses.

For Samples 1-3, 6, and 21, the ratios Tv/Rv falls within a range from 0.3 to 2.0. Accordingly, when the laminated bodies of Samples 1-3, 6, and 21 are applied to touch panel containing apparatuses, the laminated bodies can be provided with a function of a half mirror.

Sample 6 exhibits a relatively high haze value. The high haze value indicates that the laminated film has deteriorated by the heat treatment. Accordingly, for Sample 6, the thermally tempering treatment of the glass substrate is preferably not performed.

As described above, preferred embodiments and the like have been described in detail. However, the present invention is not limited to the embodiments, or the like, but various variations, and replacements may be made without departing from the scope recited in claims.

What is claimed is:

1. A laminated body comprising:
   a glass substrate; and
   a laminated film installed on a surface of the glass substrate, wherein
      the laminated film comprises, from a side of the glass substrate,
         a first layer comprising silicon nitride;
         a second layer comprising silicon; and
         a third layer comprising silicon nitride,
      a thickness of the first layer is from 5 nm to 30 nm;
      a thickness of the second layer is from 3 nm to 40 nm;
      a thickness of the third layer is from 5 nm to 60 nm;
      a transmittance of visible light incident from the side of the glass substrate is greater than or equal to 10%, and
      a surface resistance value measured from a side of the laminated film is greater than 200 Ω/sq,
      wherein a ratio of the transmittance of visible light Tv to a reflectance of visible light reflected from a side of the glass substrate Rv, Tv/Rv, is greater than or equal to 0.3 and less than or equal to 2.0.

2. The laminated body according to claim 1, wherein the second layer comprises aluminum in an amount not exceeding 30 percent by mass.

3. The laminated body according to claim 1, wherein
each of a content of oxygen in the second layer and a content of nitrogen in the second layer is less than 10 atomic percent, and
a sum of the content of oxygen and the content of nitrogen is less than 15 atomic percent.

4. The laminated body according to claim 1, wherein
a ratio of a content of nitrogen in the second layer to a content of silicon in the second layer, N/Si, is less than or equal to 0.10.

5. The laminated body according to claim 1, wherein the first layer, the third layer, or both comprise aluminum in an amount not exceeding 30 percent by mass.

6. The laminated body according to claim 1, wherein an oxide layer is not present between the glass substrate and the first layer.

7. The laminated body according to claim 1, wherein a protection layer is installed on a side of the third layer of the laminated film.

8. The laminated body according to claim 1, wherein the first layer and the second layer are adjacent to each other.

9. The laminated body according to claim 1, wherein the third layer and the second layer are adjacent to each other.

10. The laminated body according to claim 1, wherein the glass substrate is thermally tempered.

11. The laminated body according to claim 1, wherein an organic substance layer is installed on a surface of the laminated film.

12. The laminated body according to claim 1, wherein a number of layers in the laminated film is less than or equal to 10.

13. A door or a wall comprising:
the laminated body according to claim 1; and
a touch panel installed on a side of the laminated film of the laminated body.

14. The laminated body according to claim 1, wherein the thickness of the second layer is from 5 nm to 30 nm.

* * * * *